United States Patent [19]
Mahoney

[11] Patent Number: 4,746,822
[45] Date of Patent: May 24, 1988

[54] CMOS POWER-ON RESET CIRCUIT

[75] Inventor: John Mahoney, San Jose, Calif.

[73] Assignee: Xilinx, Inc., San Jose, Calif.

[21] Appl. No.: 841,910

[22] Filed: Mar. 20, 1986

[51] Int. Cl.$^4$ ............................................. H03K 17/22
[52] U.S. Cl. .................... 307/594; 307/246; 307/585; 307/597; 307/605
[58] Field of Search .................. 307/200 B, 443, 450, 307/451, 354, 362, 246, 570, 584, 585, 264, 265, 592, 594, 547, 601, 603, 605; 340/636, 660

[56] References Cited

U.S. PATENT DOCUMENTS

| | | | |
|---|---|---|---|
| 4,300,065 | 11/1981 | Remedi et al. | 307/264 X |
| 4,446,381 | 5/1984 | Dalrymple | 307/200 B |
| 4,553,054 | 11/1985 | Kase et al. | 307/605 X |
| 4,558,233 | 12/1985 | Nakamori | 307/594 X |
| 4,581,552 | 4/1986 | Womack et al. | 307/594 |
| 4,591,745 | 5/1986 | Shen | 307/594 X |

FOREIGN PATENT DOCUMENTS 2128831 5/1984 United Kingdom ................ 307/443

Primary Examiner—Stanley D. Miller
Assistant Examiner—D. R. Hudspeth
Attorney, Agent, or Firm—Alan H. MacPherson; Paul J. Winters; David W. Heid

[57] ABSTRACT

A CMOS power-on reset circuit furnishes a reset signal for bringing the components of a circuit to a defined initial state when the common supply voltage is turned on. The output signal of the reset circuit assumes a first constant value as soon as the supply voltage rises above the level required to turn on the pulldown transistor of an initializing inverter in the reset circuit. A delay circuit causes the output signal of the reset circuit to remain at the first constant value for a period of time sufficient to allow the components of the circuit to settle. The output signal of the reset circuit is then forced to a second constant value. The reset circuit is suitable for use with power supply voltages which rise very rapidly or with power supply voltages which rise very slowly (DC sweep).

18 Claims, 2 Drawing Sheets

CMOS POWER-ON RESET CIRCUIT

FIELD OF THE INVENTION

This invention relates to a power-on reset circuit and in particular to a power-on reset circuit for use with CMOS integrated circuits.

BACKGROUND OF THE INVENTION

A power-on reset circuit provides a reset signal to initialize various components of a circuit when power is applied to the circuit. Typically, some circuit components, including logic elements and flip-flops, require a certain amount of time to reach a stable operating condition (i.e., to "settle") after receipt of a reset signal. Hence it is important to maintain the reset signal at a first selected level for a selected period of time sufficient to allow the circuit components to settle. After this selected period of time the reset signal is maintained at a second selected level as long as power is applied to the circuit.

The power supplies used for an integrated circuit have various rise times and it is therefore desirable to provide a CMOS power-on reset circuit which provides a delay period sufficient to allow circuit components to settle whether the rise time of the power supply is slow or extremely fast.

SUMMARY OF THE INVENTION

This invention provides a CMOS power-on reset circuit which furnishes a reset signal for bringing the components of a circuit to a defined initial state when the common supply voltage is turned on. The reset signal is maintained at a first constant value for a selected period of time sufficient to enable the components of the circuit to settle and then the reset signal is forced to a second constant value complementary to the first value.

The reset signal is the output signal of an initializing buffer. This output signal assumes a first constant value as soon as the magnitude of the supply voltage rises above the level required to turn on the pulldown transistor in an initializing inverter in the initializing buffer. A delay circuit causes the output signal of the initializing buffer to remain at the first constant value for a selected delay period sufficient to enable the components of the circuit to settle. The output signal then changes to a second constant value.

The delay circuit includes a resistive means which does not conduct until the supply voltage has risen above a selected voltage level higher than the voltage level required to turn on the pulldown transistor in the initializing inverter. The time required for the supply voltage to rise from the level required to turn on the pulldown transistor in the initializing inverter to the level required to cause the resistive means to conduct constitutes one portion of the selected delay period. A second portion of the delay period is provided by a capacitor having a selected capacitance connected to the output node of the resistive means which in conjunction with the resistance provided by the resistive means delays the rise of the voltage level on the output node of the resistive means to a second selected level for a selected period of time. When the voltage on the output node of the resistive means rises above the second selected level, an input (secondary) inverter in the initializing buffer goes low, which in turn forces the output signal of the initializing inverter to its second constant value.

The CMOS power-on reset circuit of the invention is suitable for use with a supply voltage that rises slowly, (DC sweep), or with a supply voltage that rises very rapidly, for example, a supply voltage that rises to one-half of its maximum value in less than 100 nanoseconds, or with a voltage supply having an intermediate rise time.

For a supply voltage which rises slowly, the principal portion of the delay period is provided by the first portion of the delay period, i.e., the time required for the supply voltage to rise from the level required to turn on the pulldown transistor in the initializing inverter to the level required to cause the resistive means to conduct. On the other hand, for a supply voltage which rises rapidly the principal portion of the delay period is the second portion, i.e., the portion provided by the capacitor in conjunction with the resistance of the resistive means, which delays the time the voltage signal provided to the input (secondary) inverter of the initializing buffer rises above the trigger point of the input (secondary) inverter.

DETAILED DESCRIPTION

Figure 1:
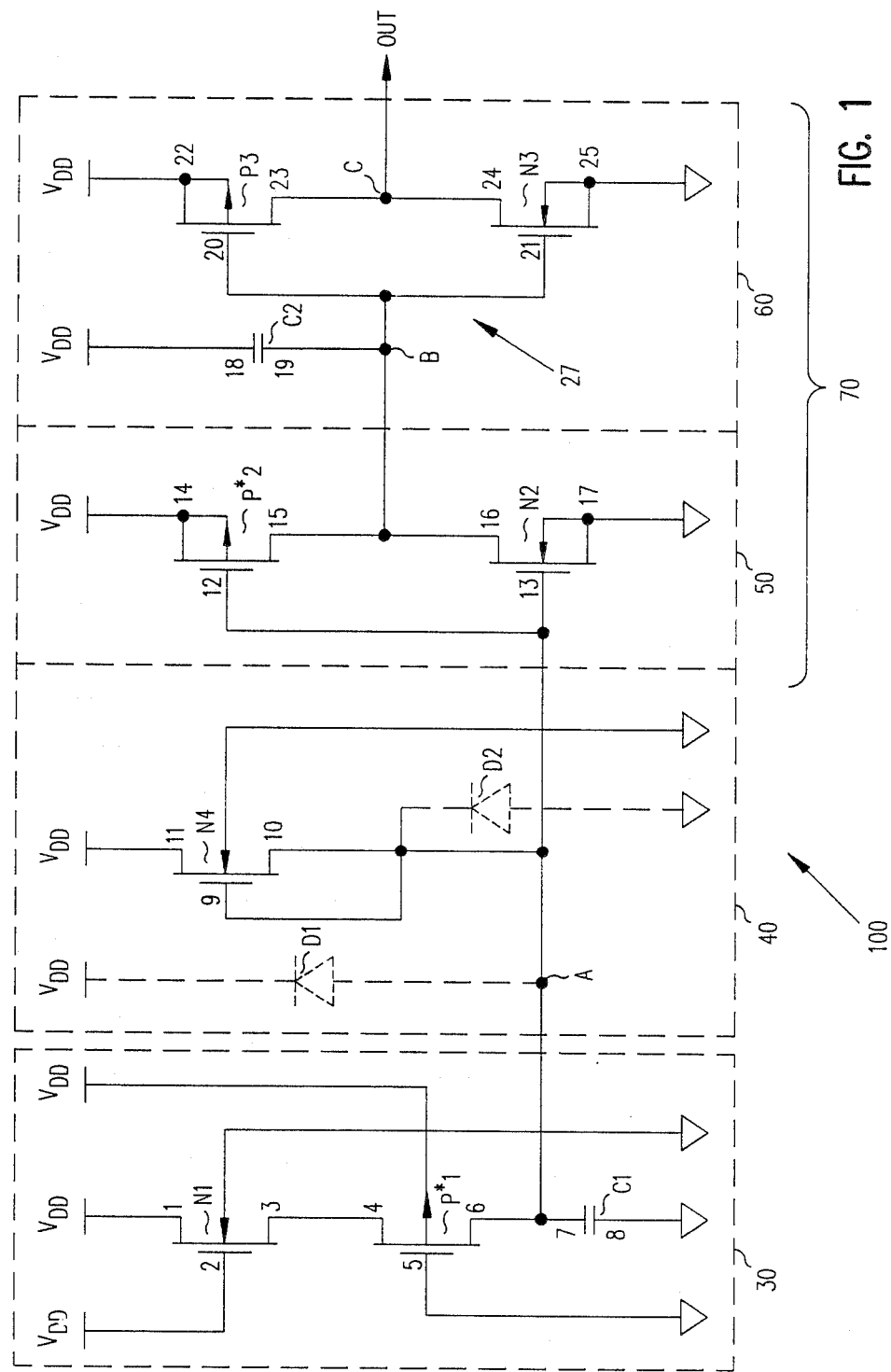
FIG. 1 shows a power-on reset circuit according to the present invention.

FIG. 1 shows one embodiment of CMOS power-on reset circuit 100. Circuit 100 is a power-on reset circuit for an integrated circuit which is compatible with a wide range of rise times of the supply voltage $V_{DD}$. Power-on reset circuit 100 includes initializing buffer 70, delay circuit 30, and discharge circuit 40. Initializing buffer 70 includes input (secondary) inverter 50 and initializing circuit 60.

Initializing circuit 60 includes capacitor C2 and initializing inverter 27. Inverter 27 comprises P channel enhancement mode transistor P3 and N channel enhancement mode transistor N3. Plate 18 of capacitor C2 is connected to the positive voltage supply $V_{DD}$ and plate 19 of capacitor C2 is connected to node B which in turn is connected to gates 20 and 21 of transistors P3 and N3, respectively. Source 22 of transistor P3 is connected to the positive voltage supply $V_{DD}$, and source 25 of transistor N3 is connected to ground. Drains 23 and 24 of transistors P3 and N3, respectively, are connected to output node C.

Input (secondary) inverter 50 comprises unimplanted P channel enhancement mode transistor P*2 and enhancement mode N channel transistor N2. (An asterisk is used in this specification to denote an unimplanted transistor). Gates 12 and 13 of transistors P*2 and N2 are connected to node A, and drains 15 and 16 of transistors P*2 and N2, respectively, are connected to node B which is connected to gates 20 and 21 of transistors P3 and N3 of initializing inverter 27. Source 14 of transistor P*2 is connected to $V_{DD}$ and source 17 of transistor N2 is connected to ground.

Delay circuit 30 includes N channel enhancement mode transistor N1 and unimplanted P channel transistor P*1. Gate 2 and drain 1 of transistor N1 are connected to the supply voltage $V_{DD}$ and source 3 of N1 is connected to source 4 of transistor P*1. Gate 5 of transistor P*1 is connected to ground and drain 6 of transistor P*1 is connected to plate 7 of capacitor C1 whose other plate 8 is connected to ground. Output node A is connected to plate 7 of capacitor C1 which is chosen to have a capacitance of 10 picofarads in one embodiment.

Discharge circuit 40 includes parasitic diodes D1 and D2 and N channel enhancement mode transistor N4. Diode D1, whose anode is connected to node A and whose cathode is connected to the supply voltage $V_{DD}$, represents the parasitic diode between the drain and the substrate of transistor P*1. Diode D2, whose anode is connected to ground and whose cathode is connected to the source of N channel transistor N4, represents the junction diode between source 10 and the substrate of N channel transistor N4. Drain 11 of transistor N4 is connected to the positive power supply $V_{DD}$. Gate 9 and source 10 of transistor N4 are connected to node A.

The operation of circuit 100 may be understood from an examination of the following cases:

1. Assume that the rate at which the supply voltage $V_{DD}$ rises is very fast. For example, assume that the rise time of the 5-volt power supply for an integrated circuit of which circuit 100 is a part is on the order of 100 nanoseconds or less. Assume the 5-volt power supply for the integrated circuit will charge to at least 2.5 volts in 100 nanoseconds or less.

Assume, also, as initial conditions, that at time $T_O$, $V_{DD}$ is 0 volts, and that the voltage on node A is 0 volts so that N channel enhancement mode transistor N2 is off. Since N channel transistor N2 is off, as the voltage rises on plate 18 of capacitor C2 (5 picofarads), the voltage on plate 19 (which is connected to node B) of capacitor C2 also rises with $V_{DD}$. Since the voltage on node B, which is connected to gate 20 of P channel transistor P3 rises with $V_{DD}$ and since $V_{DD}$ is also the voltage on source 22 of transistor P3, P channel transistor P3 remains off. As soon as the voltage on node B, which is also tied to gate 21 of N channel transistor N3 rises above the threshold voltage of transistor N3, pull-down transistor N3 turns on and the voltage on node C goes low and is held at 0 volts. The zero output voltage on node C is the reset signal to the remainder (not shown) of the integrated circuit connected to node C. The delay circuit 30 is designed to ensure that the output signal on node C remains at 0 volts for a period of time (typically 1 to 2 microseconds) sufficient to enable the remainder of the integrated circuit (not shown) to "settle" before the output voltage on node C is forced to a logical 1.

Capacitor C1 of delay circuit 30 will not begin to charge until both transistor N1 and transistor P*1 turn on (conduct). Transistor N1 cannot turn on until the voltage $V_{DD}$ tied to gate 2 rises above the N channel threshold of transistor N1. Similarly, transistor P*1 does not turn on until the voltage between source 4 and gate 5 is above the unimplanted P channel threshold voltage of transistor P*1. Thus, $V_{DD}$ must be greater than the sum of the threshold voltage with body effect of unimplanted P channel transistor P*1 plus the threshold voltage with body effect of transistor N1 before both transistor N1 and P*1 turn on. Since this sum is higher than the threshold voltage of N channel transistor N3 in initializing circuit 60, transistor N3 will have turned on, causing the output voltage on node C to fall to 0 volts, prior to the time that N channel transistor N1 and unimplanted P channel transistor P*1 are turned on. However, in the absence of capacitor C1, since the voltage signal $V_{DD}$ is by assumption rising rapidly (the rise time is 100 nanoseconds or less), the delay between the time transistor N3 turns on and the time transistors N1 and P*1 turn on is not necessarily sufficient to enable the remainder of the integrated circuit (not shown), connected to output node C, to settle before the voltage on node A rises above the trigger point of input (secondary) inverter 50, causing the intermediate signal from inverter 50 to go low, which in turn causes the output voltage of initializing inverter 27 to go high.

The purpose of capacitor C1, which has a capacitance of 10 picofarads in one embodiment, is to create a further delay in the rise of the voltage on node A after transistors N1 and P*1 turn on. Transistors N1 and P*1 are selected to have high on resistance, for example, greater than 100K ohms. This may be achieved by adjusting the ratio of channel width w to channel length l. In one embodiment, a ratio of w/l of 1/5 is employed. This creates an RC time required to charge capacitor C1 on the order of 2 to 10 microseconds. This additional delay time is sufficient to allow the remainder of the integrated circuit (not shown) connected to output node C to settle before the voltage on node A rises above the trigger point of input (secondary) inverter 50 of initializing buffer 70, forcing the voltage on node B low which forces inverter 27 to provide a high output signal on node C.

Figure 2:
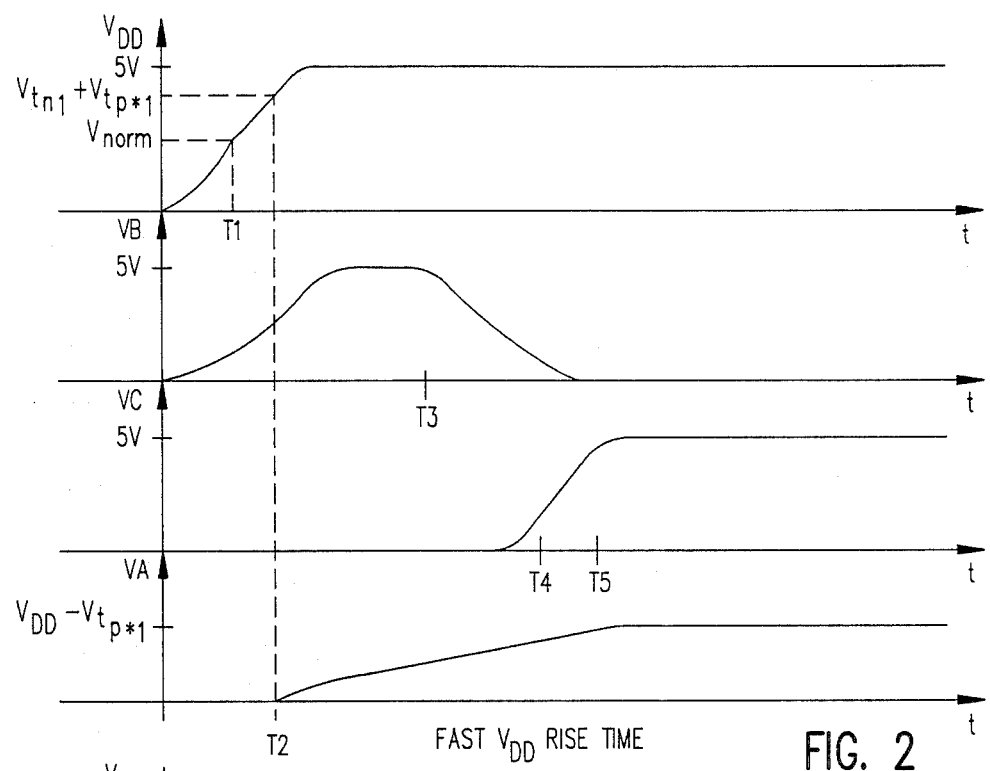
FIG. 2 illustrates the response of the power-on reset circuit according to the present invention for a fast power supply voltage rise time.

FIG. 2 illustrates the case when $V_{DD}$ rises very fast. At time T1, $V_{DD}$ is high enough to allow the logic components (not shown) in the rest of the circuit to start to operate normally. $V_{norm}$ is approximately equal to the greater of either a normal P channel enhancement mode transistor threshold voltage or a normal N channel enhancement mode transistor threshold voltage. Since node C is zero at this time, the logic components (not shown) will settle in the reset condition. The rest of the circuit is designed to make this happen. During the time from T1 to T5 these logic components will be resetting. At T5, the output of the power-on-reset signal (node C) is high enough to stop resetting the internal logic components.

Since $V_{DD}$ rises very quickly, the voltage on node B (VB) will rise very quickly. The voltage on node A (VA) will not start to rise until $V_{DD}$ rises above the sum of the threshold voltages of N1 and P*1 ($V_{tN1} + V_{tP*1}$). The RC delay of C1 and the resistance of N1 and P*1 causes VA to rise slower than $V_{DD}$'s quick rise time. At T3, VA has risen high enough to trip the secondary inverter 50 in the initializing buffer. At T4, the voltage on node B (VB) is low enough to trip the primary output inverter 27 of the initializing buffer. Finally, resetting is complete at T5.

2. Assume that the rate at which the supply voltage rises is very slow (DC sweep). Assume again, as an initial condition, that at time $T_O$, $V_{DD}$ is 0 volts and that the voltage on node A is 0 volts so that N channel enhancement mode transistor N2 is off. In this case, the circuit operates as explained above, except that node B is pulled high by unimplanted P channel enhancement mode transistor P*2 as soon as $V_{DD}$ rises above an unimplanted P channel threshold, turning P*2 on. However, now the time between the time the transistor N3 turns on, providing a low output signal on node C, and the time transistors N1 and P*1 turn on is itself (i.e., even without capacitor C1) ample time for the remainder of the integrated circuit (not shown) connected to node C to settle. Thus the remainder of the integrated circuit has settled before the voltage on node A rises above the trigger point of input (secondary) inverter 50, which forces the voltage on node B low, forcing inverter 27 to provide a high output signal on node C. In this case, capacitor C1 also provides an additional delay of 2-10 microseconds as before, but this is not needed when $V_{DD}$ rises slowly (DC sweep) since the delay time between the time inverter 27 goes low and the time transistor N1 and P*1 turn on is ample time for the circuit to settle.

Figure 3:
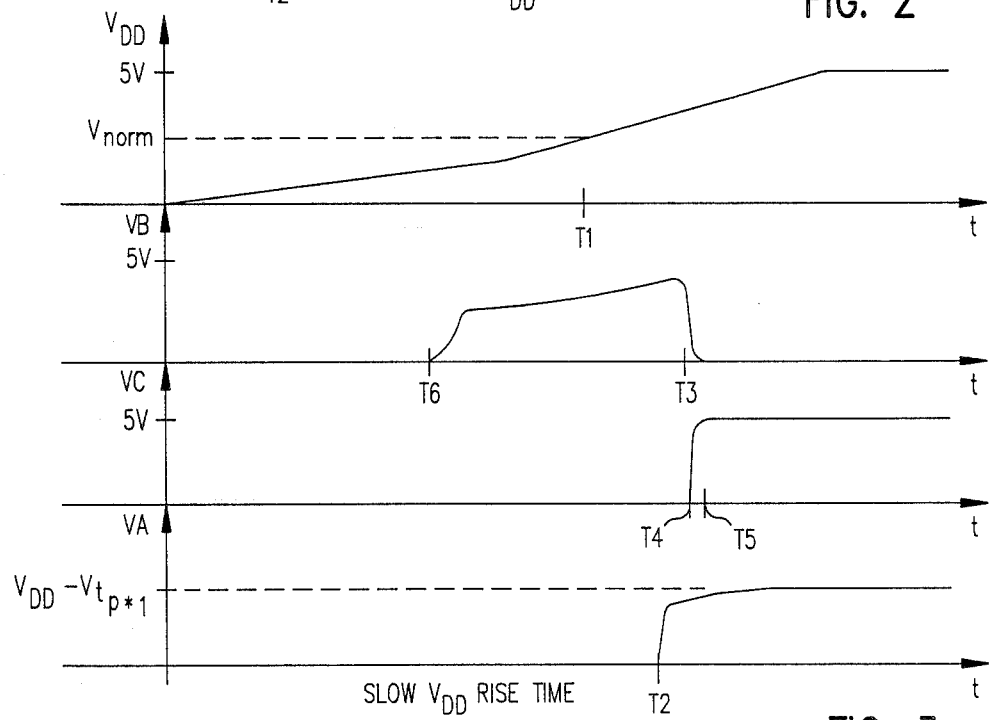
FIG. 3 illustrates the response of the power-on reset circuit according to this invention for a slow power supply voltage rise time.

FIG. 3 illustrates the case when $V_{DD}$ rises very slowly. The voltage on node B is zero until $V_{DD}$ rises above the unimplanted threshold voltage of P*2. At that time (T6), P*2 will turn on causing VB to rise to $V_{DD}$ and follow $V_{DD}$ as it continues to rise. At T2, $V_{DD}$ has risen to the sum of the threshold voltages of P*1 and N1 ($V_{tN1}+V_{tP*1}$). At this time, the voltage on node A will quickly rise to $V_{DD}$ minus the threshold voltage of N1. VA will continue to rise at the same rate as the rate of $V_{DD}$'s rise time. The quick rise of VA at time T2 is high enough to trip inverter 50 which in turn trips inverter 27 as described above when explaining FIG. 2.

The important difference between the two figures (i.e. FIGS. 2 and 3) is what causes the delay from T1 to T5. When $V_{DD}$ rises fast, this delay is caused by the RC delay in charging C1. When $V_{DD}$ rises slowly, this delay is caused by $V_{DD}$'s slow rise time. Once $V_{DD}$ rises to $V_{norm}$, $V_{DD}$ takes time to rise to the sum of the threshold voltage of N1 ($V_{tN1}$) plus the threshold voltage of P*1 ($V_{tP*1}$).

Note that the time scale on FIG. 2 is totally different from the time scale on FIG. 3.

Thus, whether the rise time of the supply voltage $V_{DD}$ is fast or slow, the reset signal provided by power-on reset circuit 100 remains at zero volts for a sufficient period of time for the remainder of the integrated circuit to settle before the output signal of circuit 100 goes high.

It should be noted that diode D1 (the parasitic P channel drain diode of transistor P*1), in discharge circuit 40 has a leakage current which charges capacitor C1. However this current is small and is more than offset by the leakage current from plate 7 of capacitor C1 to ground and by the leakage to ground from source 10 of N channel transistor N4 via parasitic diode D2.

Of importance, diode D1 serves a useful function when the power supply $V_{DD}$ is turned off. Under this circumstance, diode D1 becomes forward biased and quickly discharges capacitor C1 so that the delay circuit 30 is then ready to properly perform when the power supply voltage $V_{DD}$ is turned on again. Diode D1 will only discharge capacitor C1 to a voltage level of approximately 0.6 volts at which voltage transistor N2 may still be on. Diode-connected transistor N4 is connected to node A to discharge capacitor C1 to an N channel threshold voltage level low enough to ensure that transistor N2 is off.

When $V_{DD}$ is 5-volts, the voltage on node A will only rise to approximately 3.6 volts due to the threshold drop across transistor N1. Therefore transistor P*2 is unimplanted to ensure that it is off when the voltage on node A is approximately 3.6 volts. This ensures that steady state current is not dissipated through input (secondary) inverter 50.

The above description of the invention is meant to be exemplary and not limiting, and in light of the above description, many modifications and substitutions will be obvious to one of average skill in the art without departing from the scope of the invention.

I claim:

1. A CMOS power-on reset circuit comprising:
an initializing circuit having an input terminal and an output terminal, said initializing circuit providing a first constant voltage signal to said output terminal in response to a supply voltage rising above a first selected value;
a delay circuit, responsive to said supply voltage for providing a first intermediate signal, said delay circuit comprising
a resistive means having an output terminal and a first terminal;
a capacitor having a first and a second plate, said first plate of said capacitor being connected to said output terminal of said resistive means, said second plate of said capacitor for connecting to a reference voltage;
wherein said resistive means conducts if and only if said supply voltage rises above a third selected value;
wherein said supply voltage is applied to said first terminal of said resistive means;
wherein said first intermediate signal is provided to said output terminal of said resistive means after said supply voltage rises above said third selected value; and further
wherein said first intermediate signal rises above a second selected value on said output terminal of said resistive means a selected period of time after said supply voltage rises above said first selected value such that said initializing circuit provides a first constant output signal;
an inverting means having an input terminal and an output terminal, said input terminal of said inverting means being connected to said output terminal of said resistive means and said output terminal of said inverting means being connected to said input terminal of said initializing circuit, said input terminal of said inverting means receiving said first intermediate signal and said inverting means providing a second intermediate signal, complementary to said first intermediate signal, to said input terminal of said initializing circuit in response to said first intermediate signal rising above said second selected value on said output terminal of said resistive means, said second intermediate signal causing said initializing circuit to provide a second constant voltage signal to said output terminal of said initializing circuit.

2. A CMOS power-on reset circuit as in claim 1 wherein said third selected value is greater than said first 3. A CMOS power-in reset circuit as in claim 1 wherein said resistive means comprises:
a first transistor having a gate, a first drain/source and a second drain/source; and,
a second transistor having a gate, a first drain/souce and a second drain/source, said gate and said first drain/source of said first transistor being connected to said first terminal of said resistive means, said second drain/source of said first transistor being connected to said first drain/source of said second transistor, said gate of said second transistor for being connected to a reference voltage, said second drain/source of said second transistor being connected to said output terminal of said resistive means, said selected time period, after said supply voltage rises above said first selected value such that said initializing circuit provides a first constant output signal, being determined by the threshold voltages of said first and second transistors, the on resistances of said first and second transistors and the capacitance of said capacitor.

4. A CMOS power-on reset circuit as in claim 3 wherein said first transistor is an N channel enhancement mode transistor and wherein said second transistor is a P channel enhancement mode transistor.

5. A CMOS power-on reset circuit as in claim 1 wherein said inverting means comprises a CMOS inverter and wherein said second selected value is the trigger point of said CMOS inverter.

6. A CMOS power-on reset circuit as in claim 5 wherein said CMOS inverter comprises a P channel enhancement mode transistor and an N channel enhancement mode transistor.

7. A CMOS power-on reset circuit as in claim 1 wherein said initializing circuit comprises a CMOS inverter connected to a capacitor.

8. A CMOS power-on reset circuit comprising:
an initializing circuit for providing a first constant voltage output signal in response to a supply voltage signal rising above a first selected value.
a delay circuit responsive to said supply voltage signal for providing a first intermediate voltage signal, said first intermediate voltage signal rising above a second selected value a selected period of time after said supply voltage signal rises above said first selected value; and
an inverting means for receiving said first intermediate signal and for providing a second intermediate signal complementary to said first intermediate signal to said initializing circuit in response to said first intermediate signal rising above said second selected value, said second intermediate signal causing said initializing circuit to provide a second constant voltage output signal,
wherein said delay circuit comprises:
resistive means having an output terminal and a first terminal for receiving said supply voltage signal; and
a capacitor having a first and second plate, said first plate of said capacitor being connected to said output terminal of said resistive means, said second plate of said capacitor for connecting to a reference voltage, wherein said resistive means conducts if and only if said supply voltage signal rises above a third selected value;
wherein said resistive means comprises:
a first transistor having a gate, a first drain/source and a second drain/source; and
a second transistor having a gate, a first drain/source and a second drain/source,
said gate and said first drain/source of said first transistor being connected to said first terminal of said resistive means, said second drain/source of said first transistor being connected to said first drain/source of said second transistor, said gate of said second transistor for being connected to a reference voltage, said second drain/source of said second transistor being connected to said output terminal of said resistive means, said selected time period being determined by the threshold voltages of said first and second transistors, the on resistance of said first and second transistors and the capacitance of said capacitor;
wherein said first transistor is an N channel enhancement mode transistor and wherein said second transistor is an unimplanted P channel enhancement mode transistor.

9. A CMOS power-on reset circuit as in claim 8 further comprising a discharge circuit having a first lead connected to said first plate of said capacitor and having a second lead for connecting to said supply voltage, said discharge circuit rapidly discharging said capacitor when said supply voltage becomes zero volts.

10. A CMOS power-on reset circuit as in claim 9 wherein said discharge circuit comprises an N channel enhancement mode transistor having a gate, a first source drain and a second drain/source, said first drain/source being connected to said first lead of said discharge circuit, said second source/drain being connected to said second lead of said discharge circuit, and said gate being connected to said first lead of said discharge circuit.

11. A CMOS power-on reset circuit comprising:
an initializing circuit for providing a first constant voltage output signal in response to a supply voltage signal rising above a first selected value;
a delay circuit responsive to said supply voltage signal for providing a first intermediate signal, said first intermediate signal rising above a second selected value a selected period of time after said supply voltage signal rises above said first selected value; and
an inverting means for receiving said first intermediate signal and for providing a second intermediate signal complementary to said first intermediate signal to said initializing circuit in response to said first intermediate signal rising above said second selected value, said second intermediate signal causing said initializing circuit to provide a second constant voltage output signal,
wherein said initializing circuit comprises a CMOS inverter connected to a capacitor, and wherein said CMOS inverter comprises:
a P channel enhancement mode transistor having a gate, a source and a drain;
an N channel enhancement mode transistor having a gate, source and a drain; and,
wherein said capacitor has a first and a second plate, said first plate of said capacitor for being connected to said supply voltage signal, said second plate of said capacitor being connected to said gate of said P channel transistor and to said gate of said P channel transistor and to said gate of said N channel transistor, the source of said P channel transistor for being connected to said supply voltage, said drain of said P channel transistor being connected to said drain of said N channel transistor, said source of said N channel transistor for being connected to a reference voltage.

12. A CMOS power-on reset circuit as in claim 11 wherein the threshold voltage of said N channel enhancement mode transistor of said CMOS inverter is said first selected value.

13. A CMOS power-on reset circuit comprising:
an initializing buffer having an input lead and output lead, a first power supply lead for connecting to a power supply and a second power supply lead for connecting to a reference voltage;

a delay circuit having a first power supply lead for connecting to said power supply, a second power supply lead for connecting to said reference voltage and an output lead connected to said input lead of said initializing buffer, wherein said delay circuit comprises:

a resistive means having a first lead connected to said first power supply lead of said delay circuit and an output lead connected to said output lead of said delay circuit;

a capacitor having a first and a second plate, said first plate of said capacitor being connected to said output lead of said resistive means, said second plate of said capacitor being connected to said second power supply lead of said delay means wherein said resistive means conducts if and only if said power supply voltage rises above a third selected value;

said initializing buffer providing a first constant signal on its output lead in response to a voltage on said first power supply lead rising above a first selected level;

said delay circuit providing an intermediate signal on its output lead after said power supply voltage rises above said third selected value and said intermediate signal having a magnitude less than a second selected value for a first period of time greater than the time required for said voltage on said first power supply lead to rise above said first selected value such that said initializing buffer provides said first constant output signal, said intermediate signal rising above said second level after said first period of time, causing said initializing buffer to provide a second constant signal on its output lead.

14. A CMOS power-on reset circuit as in claim 13 wherein said resistive means comprises:

a first transistor having a gate, a first drain/source and a second drain/source; and a second transistor having a gate, a first drain/source and a second drain/source, said gate and said first drain/source of said first transistor being connected to said first lead of said resistive means, said second drain/source of said first transistor being connected to said first drain/source of said second transistor, said gate of said second transistor being connected to said second power supply lead of said delay means, said second drain/source of said second transistor being connected to said output lead of said resistive means, said first time period, greater than the time required for said voltage on said first power supply lead to rise above said first selected value such that said initializing buffer provides said first constant output signal, being determined by the threshold voltages of said first and second transistors, the on resistances of said first and second transistors and the capacitance of said capacitor.

15. A CMOS power-on reset circuit as in claim 14 including a discharge circuit having a first lead connected to said first plate of said capacitor and having a second lead connected to said first power supply lead of said delay circuit, said discharge circuit rapidly discharging said capacitor when said first power supply provides a signal of 0 volts to said first power supply leads.

16. A CMOS power-on reset circuit comprising:

an initializing buffer having an input lead and an output lead, a first power supply lead for connecting to a power supply and a second power supply lead for connecting to a reference voltage; and a delay circuit having a first power supply lead for connecting to said power supply, a second power supply lead for connecting to said reference voltage and an output lead connected to said input lead of said initializing buffer, said initializing buffer providing a first constant output signal in response to a voltage on said first power supply leads rising above a first selected level, said delay circuit providing an intermediate signal on its output lead having a magnitude less than a second selected level for a first period of time greater than the time required for said voltage on said first power supply leads to rise above said first selected level, said intermediate signal rising above said selected second level after said first period of time, causing said initializing buffer to provide a second constant output signal, and wherein said initializing buffer includes a first inverter having an output lead and an input lead connected to said input lead of said initializing buffer, a capacitor having a first plate connected to said first power supply lead of said initializing buffer and a second plate connected to said output lead of said first inverter; and a second inverter having an input lead connected to said second plate of said capacitor and an output lead connected to said output lead of said initializing buffer.

17. A CMOS power-on reset circuit as in claim 16 wherein said second selected value is the trigger point of said first inverter.

18. A CMOS power-on reset circuit comprising:

an initializing circuit for providing a first constant voltage output signal in response to a supply voltage signal rising above a first selected value;

a delay circuit responsive to said supply voltage signal for providing a first intermediate voltage signal, said first intermediate voltage signal rising above a second selected value a selected period of time after said supply voltage signal rises above said first selected value; and an inverting means for receiving said first intermediate signal and for providing a second intermediate signal complementary to said first intermediate signal to said initializing circuit in response to said first intermediate signal rising above said second selected value, said second intermediate signal causing said initializing circuit to provide a second constant voltage output signal, wherein said inverting means comprises a CMOS inverter, which in turn comprises an unimplanted P channel enhancement mode transistor and an N channel enhancement mode transistor, and wherein said second selected value is the trigger point of said CMOS inverter.

* * * * *

UNITED STATES PATENT AND TRADEMARK OFFICE
CERTIFICATE OF CORRECTION

PATENT NO. : 4,746,822
DATED : May 24, 1988
INVENTOR(S) : John Mahoney

It is certified that error appears in the above-identified patent and that said Letters Patent is hereby corrected as shown below:

Column 4, line 19, delete "length 1" and substitute --length $\ell$--.

Column 4, line 20, delete "w/1 of" and substitute --w/$\ell$ of--.

Claim 2, column 6, line 55, after "first" insert --selected value.--

Claim 3, column 6, line 60, delete "drain/souce" and substitute --drain/source--.

Signed and Sealed this

Twenty-seventh Day of September, 1988

Attest:

DONALD J. QUIGG

*Attesting Officer*     *Commissioner of Patents and Trademarks*